(12) United States Patent
Redford

(10) Patent No.: US 7,415,654 B2
(45) Date of Patent: Aug. 19, 2008

(54) DATA INTEGRITY CHECKING

(75) Inventor: John Redford, Cambridge (GB)

(73) Assignee: Broadcom Corporation, Irvine, CA (US)

( * ) Notice: Subject to any disclaimer, the term of this patent is extended or adjusted under 35 U.S.C. 154(b) by 422 days.

(21) Appl. No.: 10/928,961

(22) Filed: Aug. 30, 2004

(65) Prior Publication Data
US 2005/0289436 A1 Dec. 29, 2005

Related U.S. Application Data

(60) Provisional application No. 60/581,768, filed on Jun. 23, 2004.

(51) Int. Cl.
*G06F 11/00* (2006.01)
*G11C 29/00* (2006.01)

(52) U.S. Cl. ........................................ 714/763; 714/54

(58) Field of Classification Search ................. 714/703, 714/38, 52, 54, 746, 763
See application file for complete search history.

(56) References Cited

U.S. PATENT DOCUMENTS 6,098,194 A * 8/2000 Rinne et al. ................. 714/807
6,247,151 B1 * 6/2001 Poisner ....................... 714/718

* cited by examiner

*Primary Examiner*—Shelly A Chase
(74) *Attorney, Agent, or Firm*—Sterne, Kessler, Goldstein & Fox PLLC

(57) ABSTRACT

A tester unit for evaluating data integrity of a block of data is described. The tester unit comprises a checksum determination facility adapted for deriving a checksum value from a block of data stored in a memory, and a checksum evaluation facility adapted for comparing the derived checksum value with a predetermined checksum value, and for initiating a reload of the block in case the derived checksum value differs from the predetermined checksum value.

26 Claims, 3 Drawing Sheets

DATA INTEGRITY CHECKING

CROSS-REFERENCE TO RELATED APPLICATIONS INCORPORATION BY REFERENCE

This application is related to, and claims benefit of and priority from, Provisional Application No. 60/581,768 filed on Jun. 23, 2004 entitled "Data Integrity Checking", the complete subject matter of which is incorporated herein by reference in its entirety as if fully set forth herein.

FIELD OF THE INVENTION

This invention relates to a tester unit for evaluating data integrity of a block of data, and to an xDSL appliance comprising a tester unit. Furthermore, the invention relates to a method for evaluating data integrity of a block of data.

BACKGROUND OF THE INVENTION

In devices which contain large amounts of memory there is a non-negligible chance that the contents of that memory will become corrupted over time, due to for example the impact of radiation (soft errors) or software bugs. In such devices where the operation of the device is fundamentally dependant on the contents of memory remaining constant and uncorrupted, for example where the memory contains the program code controlling the operation of an embedded processor, then such corruption can cause the operation of the device to fail.

There are many applications for such devices where high reliability is required, for example in communication systems, where it is desirable to either minimise the frequency of failures of this nature or to at least detect the failures and restart the device in an orderly fashion rather than silently failing in unpredictable ways.

SUMMARY OF THE INVENTION

The present invention provides a tester unit for evaluating data integrity of a block of data. The tester unit comprises a checksum determination facility adapted for deriving a checksum value from a block of data stored in a memory, and a checksum evaluation facility adapted for comparing the derived checksum value with a predetermined checksum value, and for initiating a reload of the block in case the derived checksum value differs from the predetermined checksum value.

In one variant, the block of data is a block of read-only data that is not subjected to modifications.

In another variant, the block of data comprises a piece of instruction code.

In yet another variant, the memory is a RAM memory.

In another variant, the checksum value is derived by summing up the data bytes of the block of data.

In yet another aspect, the checksum value is derived by subjecting the data bytes of the data block to a predefined sequence of XOR operations.

In yet another aspect, the checksum value comprises between 2 and 8 bytes.

In another aspect, the tester module is adapted for verifying data integrity of the block of data at regular time intervals.

In another variant, the range of time intervals extends from seconds to days.

In yet another variant, the checksum determination facility is adapted for deriving one checksum value from the data of the entire memory.

In yet another variant, the memory comprises a plurality of memory portions, with the checksum determination facility being adapted for deriving a respective checksum value for each one of the memory portions.

In yet a further variant, the tester unit is implemented as a software module.

In yet a further aspect, the tester unit is stored in the same memory the block of data is stored in.

In another variant, the tester unit is implemented as a part of a loader module, said loader module being adapted for loading blocks of data into the memory.

In a further aspect, the tester unit is implemented as a dedicated hardware unit, preferably by means of an external processing unit.

In yet another aspect, the predetermined checksum value is stored at a predefined location of the memory.

In yet another variant, the predetermined checksum value is stored in an external register.

In another aspect, together with a block of data, a corresponding predetermined checksum value is loaded either to the memory or to an external register.

In yet another aspect, the block of data is loaded from an external source, in particular from one of: a communications network, the Internet, a server computer, another storage unit.

In yet a further aspect, the tester unit is used for monitoring data integrity of instruction code for an appliance in the field of telecommunications, in particular in the field of xDSL.

The present invention further provides an xDSL appliance comprising a tester unit as described above.

Furthermore, the present invention provides a method for evaluating data integrity of a block of data. The method comprises steps of deriving a checksum value from a block of data stored in a memory, comparing the derived checksum value with a predetermined checksum value, and in case the derived checksum value differs from the predetermined checksum value, initiating a reload of the block of data.

In yet a further variant, the invention provides a software program or product, preferably stored on a data carrier, for executing the method described herein when the computer program product is executed on a computer, processing unit, digital signal processor, or the like.

It is appreciated that these and other aspects of the invention will become apparent to those skilled in the art in the detailed description and drawings contained herein.

BRIEF DESCRIPTION OF THE DRAWINGS/FIGURES

DETAILED DESCRIPTION OF THE INVENTION

Figure 1:
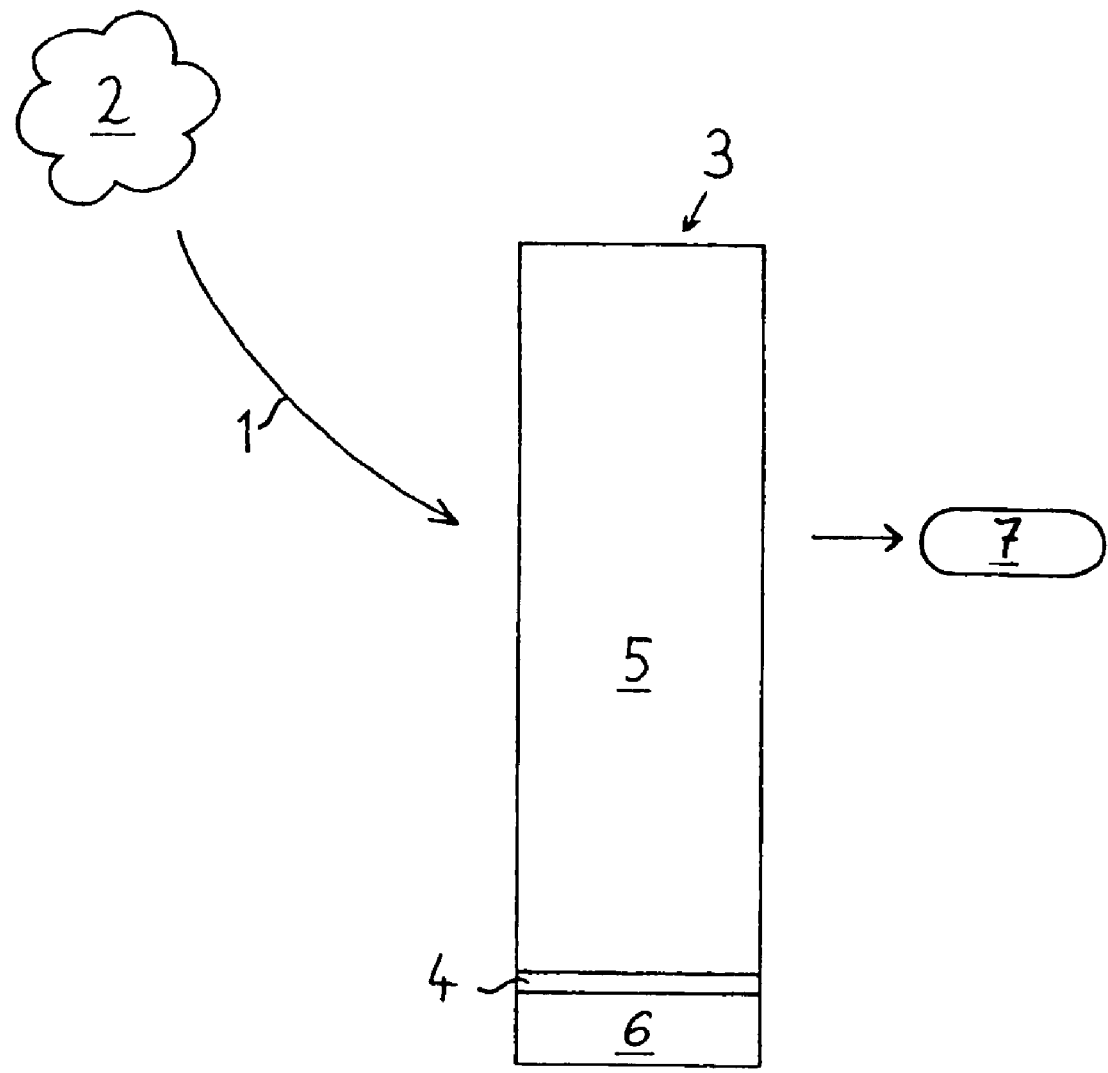
FIG. 1 shows a first embodiment of the invention, whereby the tester module is stored in the memory itself.

According to embodiments of the present invention, a tester unit for evaluating data integrity of a block of data comprises a checksum determination facility adapted for deriving a checksum value from a block of data stored in a memory. Furthermore, the tester unit comprises a checksum evaluation facility adapted for comparing the derived checksum value with a predetermined checksum value, and for initiating a reload of the block of data in case the derived checksum value differs from the predetermined checksum value.

Even if a block of data that is stored in a memory is perfectly ok at the beginning, the data might get corrupted further on. For example, due to the impact of radiation or software bugs, the values of one or more bits within the block of data might be modified at a certain point of time. Data integrity is lost, and the corrupted bits might cause the system to collapse.

A variety of different error detection and error correction codes have been developed in the past. Typically, to each data byte, one or more redundancy bits are added. However, the use of error detection and error correction codes leads to a significant increase of the required memory space in the order of 10 to 20 percent.

According to embodiments of the present invention, a checksum comprising several bytes is initially derived for the non-corrupted block of data. At a later point of time, the checksum can be derived from the block of data once more. Then, the actual checksum value is compared with the predetermined checksum value. In case the two values are equal, the block of data still is in the same state as initially. In this case, it can be concluded that data integrity of the block of data has been preserved. In case of mismatch, however, at least one bit within the block of data must have been changed. The block of data has become faulty. In order to replace the faulty block of data with non-corrupted data, the checksum evaluation facility is adapted for initiating a reload of the block of data.

Compared to the error detection and error correction codes of the prior art, the required overhead in terms of memory space is very small: for a block of data having a size in the order of kilobytes or megabytes, only a few additional bytes are required. By determining and evaluating the checksum of a block of data, it can be quickly determined whether the data still is reliable or not. In case of bit errors, the block of data can be replaced by a non-corrupted version before system crashes and other damages occur. Thus, it is possible to either minimise the frequency of failures or to at least detect the failures and restart the device in an orderly fashion rather than silently failing in unpredictable ways.

Preferably, the block of data is a block of read-only data that is not subjected to modifications. Whenever a checksum value is derived from the block of read-only data, a constant checksum value is obtained, which can be used for evaluating data integrity of the block of data.

In a preferred embodiment of the invention, the block of data comprises a piece of instruction code. With regard to instruction code, it is particularly important that data integrity is preserved, because execution of damaged instructions might cause errors and system crashes. By periodically or occasionally evaluating the checksum of the instruction code, it is at least possible to notice and eliminate the error, in order to limit the damages.

In a preferred embodiment, the memory is a RAM memory. There exist a variety of systems where read-only data such as instruction code and data is loaded to and stored in a RAM memory. Of course, read-only data might as well be stored in a ROM memory, but many systems on a chip comprise RAM memory modules. If instruction code and data is stored in a RAM memory, it can be updated on a regular basis.

There exist a wide variety of different checksum algorithms. Determining a checksum comprises condensing a large block of data to a small number such that there is a very small chance of two different large blocks of data mapping to the same small number.

According to a preferred embodiment, the checksum value is derived by summing up the data bytes of the block of data. For this purpose, the checksum determination facility might e.g. comprise some kind of loop functionality. The obtained checksum value depends on each of the data bytes of the block of data, and hence, a bit error of any of said data bytes can be detected.

In an alternatively preferred embodiment, the checksum value is derived by subjecting the data bytes of the data block to a predefined sequence of XOR operations. The output value of an XOR operation is influenced by each one of the input values. A bit error of any of the input values will therefore have an influence on the obtained result. If a checksum value that is obtained as a result of a predefined sequence of XOR operations is correct, it can be concluded that none of the data bytes is faulty.

Besides these embodiments, there exist other types of commonly used checksum algorithms, like e.g. MD5.

Preferably, the checksum value comprises between 2 and 8 bytes. For example, when data bytes of a data block comprising thousands or millions of bytes are summed up, a checksum value of this size is obtained.

In a preferred embodiment, the tester module is adapted for verifying data integrity of the block of data at regular time intervals. If a bit error occurs, for example due to radiation, this bit error will be detected during a subsequent evaluation of the checksum. Then, the faulty block of data will be reloaded. Preferably, the user won't even notice that an error has occurred. The number of system crashes can be significantly reduced by periodically evaluating the checksum.

Preferably, the range of time interval extends from seconds to days. Here, a trade-off between the degree of system security on the one hand and the additional computational expense on the other hand has to be found.

According to another preferred embodiment of the invention, the checksum determination facility is adapted for deriving one checksum value from the data of entire memory. In this embodiment, only one predetermined checksum value has to be stored. This is the lowest possible overhead for implementing the invention.

According to an alternative embodiment, the memory comprises a plurality of memory portions, with the checksum determination facility being adapted for deriving a respective checksum value for each one of the memory portions. For each of the memory portions, the derived checksum value is compared with a corresponding predetermined checksum value. This allows to determine, for each of the memory portions, whether the data contained in said memory portion is corrupted or not. In case a faulty memory portion has been identified, only the data of this memory portion has to be reloaded. By selectively reloading the faulty memory portion only, the amount of time required for fixing the error is kept small.

Preferably, the tester unit is implemented as a software module. The size of the instruction code required for determining and evaluating a checksum can be kept very small. For this reason, a software module for implementing the tester unit does not use up a lot of memory space.

According to a preferred embodiment, the tester unit is stored in the same memory the block of data is stored in. In this embodiment, no extra memory is required for implementing the tester unit.

In another preferred embodiment, the tester unit is implemented as a part of a loader module, said loader module being adapted for loading blocks of data into the memory. A loader module of this kind is required anyway for loading instruction code and data into a RAM memory. The loader module can be used for performing a reload operation whenever a faulty block of memory is detected.

According to an alternative embodiment, the tester unit is implemented as a dedicated hardware unit, preferably by means of an external processing unit. The dedicated hardware unit might be adapted for controlling and testing a variety of different memory devices, and for initiating reload operations if necessary.

Preferable, the predetermined checksum value is stored at a predefined location of the memory. No additional registers are required for storing the predetermined checksum values.

According to an alternative embodiment, the predetermined checksum value is stored in an external register. There, the predetermined checksum value might be accessed more easily.

In another preferred embodiment, together with a block of data, a corresponding predetermined checksum value is loaded either to the memory or to an external register. The predetermined checksum value can be regarded as a characteristic measure of the block's data integrity. When the block of data is loaded into the RAM memory, the associated checksum value is synchronously written to a predefined memory location or to a dedicated register.

Preferably, the block of data is loaded from an external source, in particular from one of: a communications network, the Internet, a server computer, another storage unit. The external source can be accessed in order to load the most recent version of the block of data to the memory. The external source might also be adapted for supplying the corresponding predetermined checksums. In case a block of data has become corrupted, the faulty block of data can be reloaded from said external source.

According to a preferred embodiment of the invention, the tester unit is used for monitoring data integrity of instruction code for an appliance in the field of telecommunications, in particular in the field of xDSL.

Embodiments of the present invention further relate to an xDSL appliance comprising a tester unit as described above.

In FIG. 1, a first embodiment of the invention is shown. Initially, data 1 from an external source 2 is loaded into the RAM memory 3. The external source 2 might e.g. be the Internet or any other communications network. Alternatively, the data 1 might e.g. be loaded from a server, or from a main storage. Together with the data 1, a predetermined checksum is loaded to a predefined memory location 4. The data 1 comprises at least one of: read-only data, instruction code, configuration data. During further operation, e.g. due to the impact of radiation or software bugs, one or more bits of the stored data 5 might change its value, and the data 5 might get corrupted. In order to evaluate data integrity of the stored data 5, a tester module 6 is contained in the RAM memory 3. The tester module 6 is adapted for deriving a checksum 7 from the stored data 5. There exist a variety of different methods for deriving checksums. The checksum 7 can e.g. be derived by summing up the data bytes of the stored data 5. Alternatively, the checksum 7 can be derived by subjecting the bit pattern of the stored data 5 to a sequence of XOR operations. Further alternatively, a commonly used checksum algorithm like e.g. MD5 can be employed. The derived checksum 7 indicates the instantaneous state of the stored data 5. The tester module 6 compares the derived checksum 7 with the predetermined checksum in the memory location 4. In case both checksums are identical, the stored data 5 is still identical to the data that has initially been loaded from the external source 2. In this case, it can be concluded that the stored data 5 is not corrupted. However, in case the derived checksum 7 differs from the predetermined checksum, the stored data 5 is faulty. In order to avoid system crashes and further damages, the tester module 6 resets the system and initiates a reload of the data 1 from the external source. The stored data 5 in the RAM memory 3 is replaced by non-corrupted data.

The tester module 6 is adapted for checking data integrity of the stored data 5 on a regular basis, e.g. once every 5 minutes, or once an hour, or once a day. The overhead required for evaluating data integrity in terms of time and in terms of computational expense can thus be varied. Even if the checksum is not evaluated that often, the invention will permit to significantly reduce the number of system crashes.

Figure 2:
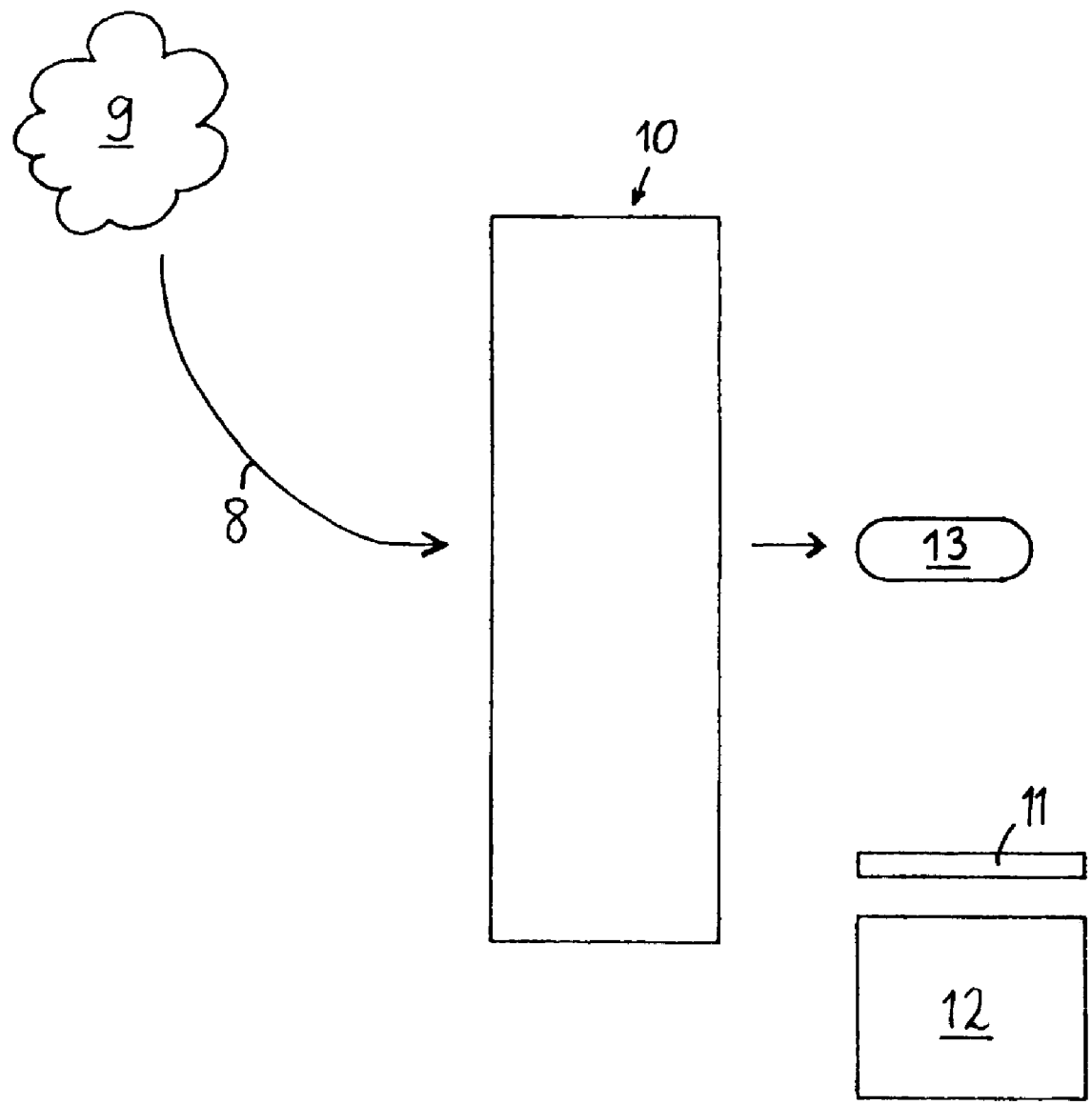
FIG. 2 shows a second embodiment of the invention comprising an external tester unit.

FIG. 2 shows a second embodiment of the invention. Data 8 is loaded from an external source 9 into the memory 10, and a corresponding predetermined checksum is written into a dedicated register 11. The tester unit 12 is implemented as an external tester unit, which might e.g. be realized by means of an external processing unit. The tester unit 12 can be adapted for checking data integrity of several memories in parallel. The tester unit 12 is adapted for periodically deriving a checksum 13 from the data stored in the memory 10, and for comparing the derived checksum 13 with the predetermined checksum 11 that corresponds to the non-corrupted state. In case of a mismatch, data is reloaded from the external source 9. The tester unit 12 might e.g. be implemented as a part of a loader module that is adapted for loading data from the external source 9.

Figure 3:
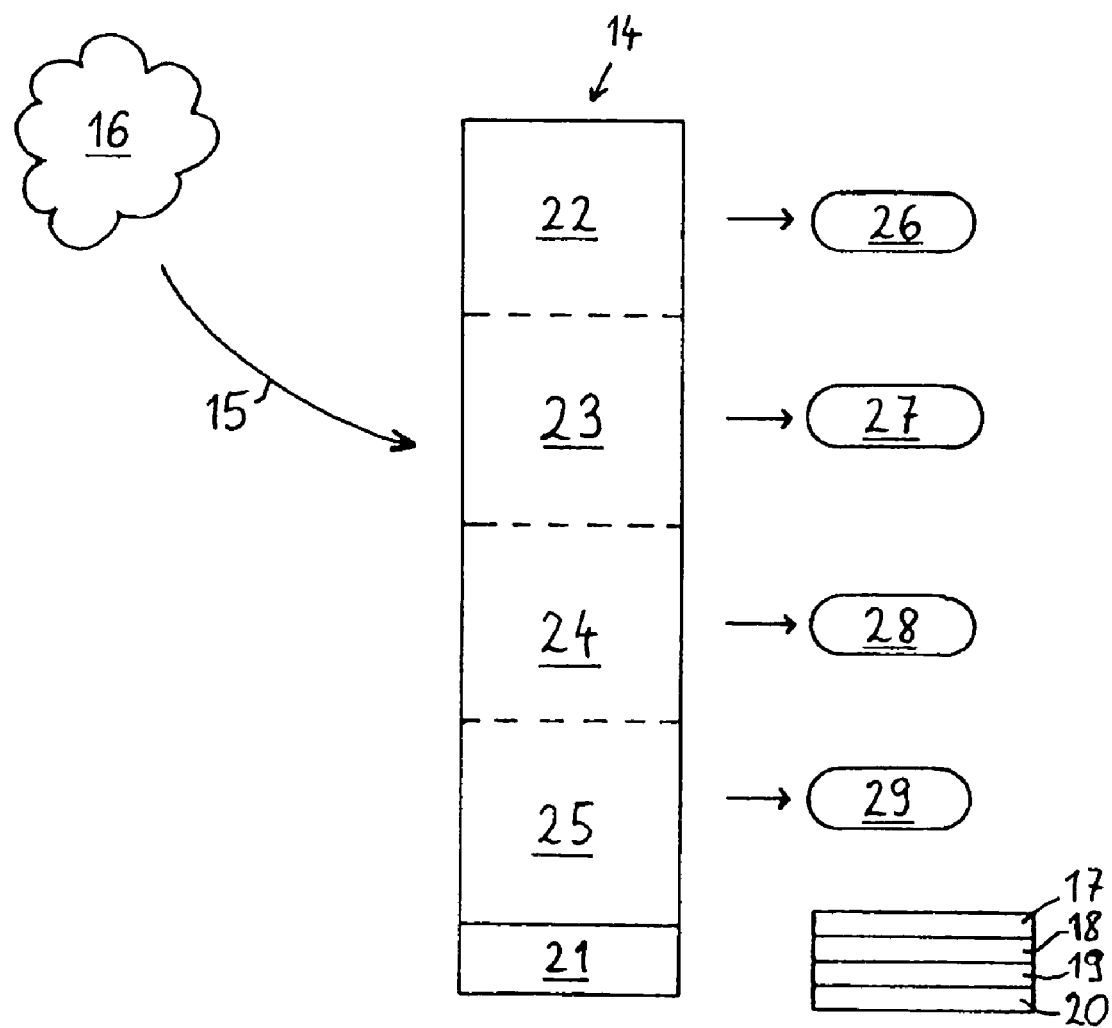
FIG. 3 shows a third embodiment of the invention, in which the memory has been divided into a plurality of memory segments.

In FIG. 3, a third embodiment of the invention is depicted. In this embodiment, the memory 14 has been segmented into a plurality of memory blocks. Initially, a set of data blocks is loaded (15) from an external source 16 and stored into the memory 14. For each of the blocks of data, a corresponding predetermined checksum is stored to the external registers 17 to 20. The memory 14 comprises a tester module 21 that is adapted for verifying data integrity of the stored data blocks 22 to 25. The tester module 21 is adapted for deriving, from each of the stored data blocks 22 to 25, a corresponding checksum 26 to 29. Next, the derived checksums 26 to 29 are compared to the corresponding checksums stored in the registers 17 to 20.

As a result, one might e.g. find that the derived checksums 26, 28, 29 are identical to the predetermined checksums stored in the registers 17, 19, 20, but that the derived checksum 27 differs from the predetermined checksum in the register 18. In this case, it can be concluded that the data blocks 22, 24, 25 are ok, whereas the data of data block 24 is faulty. Therefore, only the data block 24 has to be reloaded from the external source 16. The tester module 21 is adapted for initiating a selective reload of data block 24 from the external source 16. Compared to the solutions that have been described above, both the time and the bandwidth required for performing the reload is reduced.

What is claimed is:

1. A tester unit for evaluating data integrity of a block of data, comprising
    a checksum determination facility that derives a checksum value from a block of data stored in a memory, wherein the block of data is loaded from an external source selected from one of: a communications network, the Internet, a server computer, or another storage unit;
    a checksum evaluation facility that compares the derived checksum value with a predetermined checksum value, and for initiating a reload of the block in case the derived checksum value differs from the predetermined checksum value.

2. The tester unit of claim 1, wherein the block of data is a block of read-only data that is not subjected to modifications.

3. The tester unit of claim 1, wherein the block of data comprises a piece of instruction code.

4. The tester unit of claim 1, wherein the memory is a RAM memory.

5. The tester unit of claim 1, wherein the checksum value is derived by summing up the data bytes of the block of data.

6. The tester unit of claim 1, wherein the checksum value is derived by subjecting the data bytes of the data block to a predefined sequence of XOR operations.

7. The tester unit of claim 1, wherein the checksum value comprises between 2 and 8 bytes.

8. The tester unit of claim 1, wherein the tester unit verifies data integrity of the block of data at regular time intervals.

9. The tester unit of claim 8, wherein the range of time intervals extends from seconds to days.

10. The tester unit of claim 1, wherein the checksum determination facility derives one checksum value from the data of the entire memory.

11. The tester unit of claim 1, wherein the memory comprises a plurality of memory portions, with the checksum determination facility being adapted for deriving a respective checksum value for each one of the memory portions.

12. The tester unit of claim 1, wherein the tester unit is implemented as a software module.

13. The tester unit of claim 12, wherein the tester unit is stored in the same memory the block of data is stored in.

14. The tester unit of claim 12, wherein the tester unit is implemented as a part of a loader module, said loader module loads blocks of data into the memory.

15. The tester unit of claim 1, wherein the tester unit is implemented as a dedicated hardware unit, preferably by means of an external processing unit.

16. The tester unit of claim 1, wherein the predetermined checksum value is stored at a predefined location of the memory.

17. The tester unit of claim 1, wherein the predetermined checksum value is stored in an external register.

18. The tester unit of claim 1, wherein, together with a block of data, a corresponding predetermined checksum value is loaded either to the memory or to an external register.

19. The tester unit of claim 1, wherein the tester unit is used for monitoring data integrity of instruction code for an appliance in the field of telecommunications, in particular in the field of xDSL.

20. An xDSL appliance comprising a tester unit according to claim 1.

21. A method for evaluating data integrity of a block of data, the method comprising steps of:
   a) deriving a checksum value from a block of data stored in a memory, wherein the block of data is loaded from an external source selected from one of: a communications network, the Internet, a server computer, or another storage unit;
   b) comparing the checksum value derived in step a) with a predetermined checksum value, and
   c) in case the derived checksum value differs from the predetermined checksum value, initiating a reload of the block of data.

22. The method of claim 21, comprising a step of deriving the checksum value by summing up the data bytes of the block of data.

23. The method of claim 21, comprising a step of deriving the checksum value by subjecting the data bytes of the data block to a predefined sequence of XOR operations.

24. The method of claim 21, wherein data integrity of the block of data is verified at regular time intervals.

25. The method of claim 21, comprising a step of deriving one checksum value from the data of the entire memory.

26. The method of claim 21, comprising a step of deriving a respective checksum value for each one of a plurality of memory portions.

* * * * *